(12) United States Patent
Chen et al.

(10) Patent No.: US 7,060,547 B2
(45) Date of Patent: Jun. 13, 2006

(54) METHOD FOR FORMING A JUNCTION REGION OF A SEMICONDUCTOR DEVICE

(75) Inventors: Yu-Kun Chen, Hsin-Chu (TW);
Neng-Hui Yang, Hsin-Chu (TW);
Chin-Cheng Chien, Hsin-Chu (TW);
Hsiang-Ying Wang, Chia-I (TW)

(73) Assignee: United Microelectronics Corp. (TW)

( * ) Notice: Subject to any disclaimer, the term of this patent is extended or adjusted under 35 U.S.C. 154(b) by 193 days.

(21) Appl. No.: 10/764,437

(22) Filed: Jan. 27, 2004

(65) Prior Publication Data

US 2005/0164461 A1 Jul. 28, 2005

(51) Int. Cl.
*H01L 21/336* (2006.01)
(52) U.S. Cl. ..................... 438/197; 438/308; 438/514; 438/537
(58) Field of Classification Search ................ 438/197, 438/308, 514, 537
See application file for complete search history.

(56) References Cited

U.S. PATENT DOCUMENTS 6,794,693 B1 * 9/2004 Kakamu et al. ............ 257/257
6,798,028 B1 * 9/2004 Horstmann et al. ......... 257/412

* cited by examiner

*Primary Examiner*—Zandra V. Smith
*Assistant Examiner*—Christy Novacek

(57) ABSTRACT

A method for forming a junction region of a semiconductor device is disclosed. The steps of the method include providing a semiconductor substrate. A gate structure is formed on the semiconductor substrate. A dopant is implanted into the semiconductor substrate to form the junction region. An insulator layer is formed on the gate structure and the semiconductor substrate. A carbon-containing plasma treatment is performed to the insulator layer. A spacer is formed on a side-wall of the gate structure and the dopant is implanted into the semiconductor substrate to form a source/drain region next to the junction region. A heat treatment is performed to the semiconductor substrate.

25 Claims, 3 Drawing Sheets

METHOD FOR FORMING A JUNCTION REGION OF A SEMICONDUCTOR DEVICE

BACKGROUND OF THE INVENTION

1. Field of the Invention

The invention relatives to a method for forming a junction region of a semiconductor device, more particularly to the method for forming a junction region of a PMOS semiconductor device.

2. Description of the Prior Art

As semiconductor devices, such as complementary metal-oxide-semiconductor devices, become highly integrated, the area occupied by the devices shrinks, as well as the design rule. With advances in semiconductor technology, the dimensions of the integrated circuit (IC) devices have shrunk to the deep sub-micron region, some problems are incurred due to the process of scaling down.

With the progress of semiconductor elements, the manufacturing of semiconductor elements is more and more precise and therefore, the depth distribution of impurity atoms is more and more precise. In generally, an ion implanting method is used to precisely control the depth and concentration distributions of the impurity atoms. In the process of ion implanting, the impurity atoms with a form of charged ions are accelerated to have energy and then they can collide the silicon wafer directly to enter into a proper position in the crystal lattices. Therefore, the depth distribution of the ions can be controlled by the energy of the ion, while the dose of the impurities can be controlled by the implanting time and current of the ion beam.

In the prior art, the charged ions as an ion beam with certain energy is implanted into a silicon wafer by using an ion implanter. Then, an annealing process required for activating impurities and recovering damage, thereby causing a redistribution of the implanted ions and the occurrence of a transient enhance diffusion (TED) phenomenon. Consequently, it is difficult to form ultra shallow junctions by traditional ion-implantation. Moreover, when the line width of the devices is required to be reduced to be below 90 nm, and area of each section, including source and drain, in the metal oxide semiconductor (MOS) must also be reduced, and thus the diffusing depth of the junction must be controlled severely for reducing the short channel effect and the punch-through effect.

As device scaling for the 90 nm technology node and beyond, ultra shallow and low sheet resistance source/drain extensions (SDE) are required to suppress the short channel effect and to obtain high current drivability. Recent study has been shown towards carbon implantation as an approach for fabricating ultra shallow junctions by low energy implantation, carbon atom act to sink silicon interstitials, thereby reducing enhanced dopant diffusion. However, introduction of carbon by ion implantation can lead to higher leakage current in p-n junctions and lower throughput in production. Accordingly, it is one of considerable issues on the application of carbon implantation.

SUMMARY OF THE INVENTION

In accordance with the background of the above-mentioned invention, the traditional ion-implantation method can not form the needed ultra shallow junctions. One objective of the present invention is to provide a method for forming a junction region of a semiconductor device. Employing carbon-containing plasma treatment controls the region of the junction. Therefore, after the subsequent thermal process, the property of the element can be retained. A lower depth junction is acquired, and the diffusion in the horizontal direction is suppressed.

Another objective of the present invention is to provide a method for forming a junction region of a semiconductor device by employing carbon-containing plasma treatment, herein carbon-containing plasma treatment produces carbon ions to penetrate near the surface of the wafer substrate. The damage to the wafer substrate is reduced. This is beneficial to the recrystallization in the thermal process and does not lead to higher leakage current in p-n junctions just like ion implantation.

In accordance with the present invention, a method for forming a junction region of a semiconductor device is disclosed. The steps of the method include providing a semiconductor substrate. A gate structure is formed on the semiconductor substrate. A dopant is implanted into the semiconductor substrate to form the junction region. An insulator layer is formed on the gate structure and the semiconductor substrate. A carbon-containing plasma treatment is performed to the insulator layer. A spacer is formed on a side-wall of the gate structure and the dopant is implanted into the semiconductor substrate to form a source/drain region next to the junction region. A heat treatment is performed to the semiconductor substrate.

BRIEF DESCRIPTION OF THE DRAWINGS

The present invention can be best understood through the following description and accompanying drawings wherein.

DESCRIPTION OF THE PREFERRED EMBODIMENT

Figure 1A:
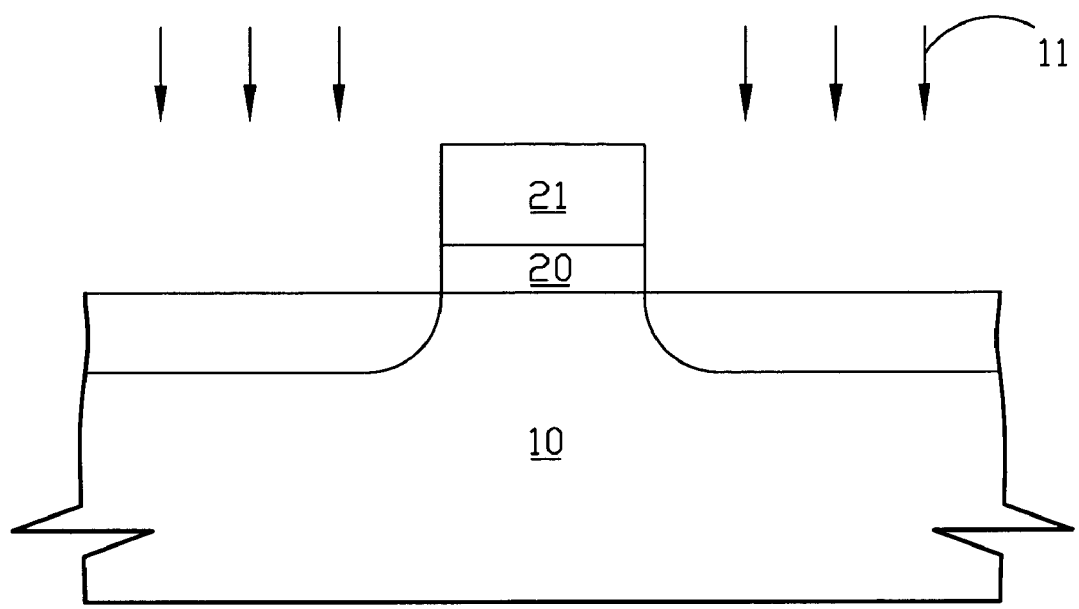
FIGS. 1A–1F are a series of cross-sectional schematic diagrams of the embodiment of the present invention.

There is shown a representative portion of a semiconductor structure of the present invention in enlarged, cross-sections of the two dimensional views at several stages of fabrication. The drawings are not necessarily to scale, as the thickness of the various layers are shown for clarify of illustration and should not be interpreted in a limiting sense. Accordingly, these regions will have dimensions, including length, width and depth, when fabricated in an actual device.

A method for forming a junction region of a semiconductor device is disclosed. The steps of the method include providing a semiconductor substrate. A gate structure is formed on the semiconductor substrate. A dopant is implanted into the semiconductor substrate to form the junction region. An insulator layer is formed on the gate structure and the semiconductor substrate. A carbon-containing plasma treatment is performed to the insulator layer. A spacer is formed on a side-wall of the gate structure and the dopant is implanted into the semiconductor substrate to form a source/drain region next to the junction region. A heat treatment is performed to the semiconductor substrate.

One embodiment of the present invention is depicted in FIGS. 1A–1F. First referring to FIG. 1A, a semiconductor substrate 10, such as a silicon substrate, is provided for the formation of p-type and/or n-type MOS devices. In one embodiment, some devices or structures (not shown) may be included in the semiconductor substrate 10, such as some doped wells or isolation devices. Next, an oxide layer and a conductive layer are sequentially formed on the semiconductor substrate 10. The oxide layer and the conductive layer are then patterned and etched by any suitable methods. Thus, a gate structure, which consists of the gate oxide layer 20 and the gate electrode 21, is formed on the semiconductor substrate 10. Alternatively, for a specified design, an offset spacer (not shown) may be formed on the side-wall of the gate structure.

Next, for some PMOS devices in an embodiment, a p-type implantation is performed for the aforesaid structure. In the embodiment, the dopant 11 of the group III, such as boron, is implanted into the semiconductor substrate 10 for the formation of a source/drain extension junction region. In a preferred embodiment, the implantation of low energy boron 11 with pre-amorphization implantation of germanium is implemented with energy on the order of 1 to 10 keV. Accordingly, the application of the present invention is not only used to form PMOS devices but also used to form NMOS devices.

Figure 1B:
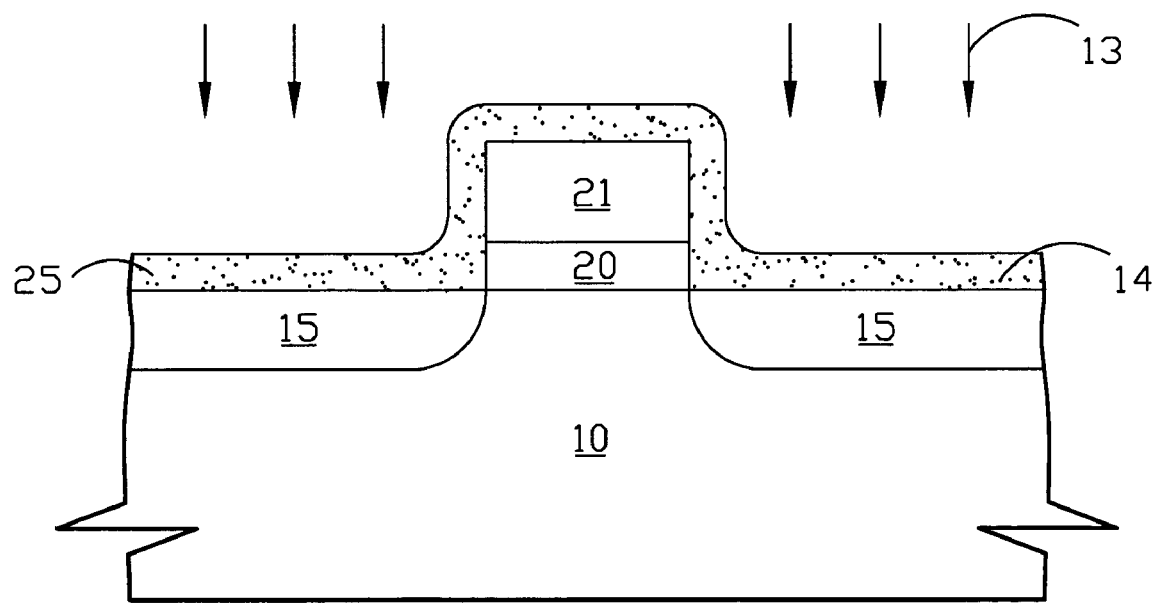
Figure 1C:
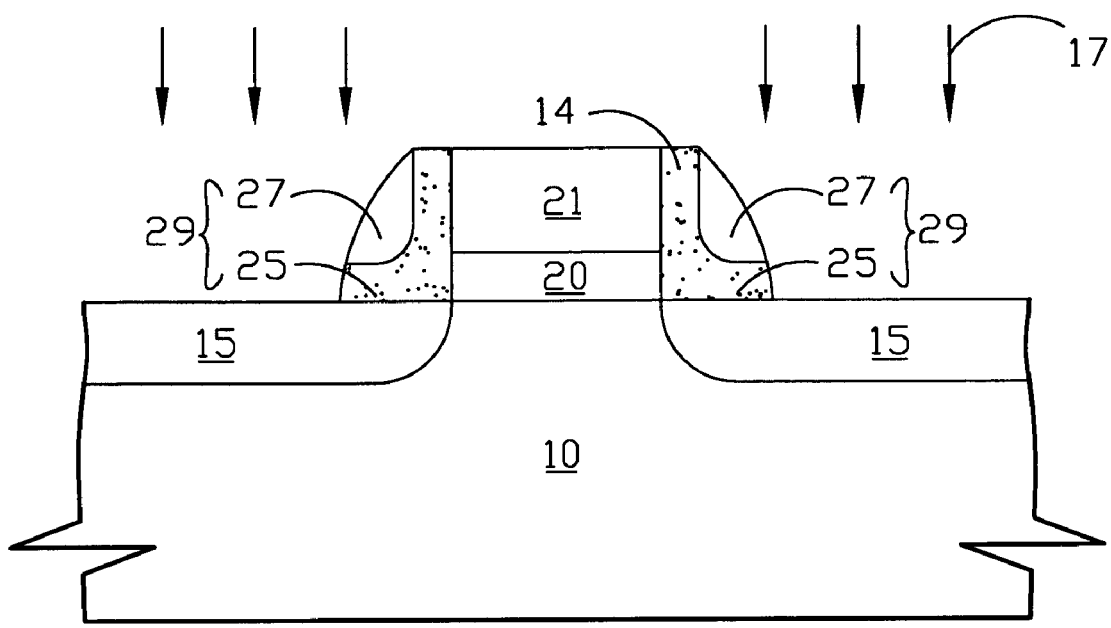

Referring to FIG. 1B, after the formation of a source/drain extension junction region 15 (having a thickness about less than 400 angstroms), an insulator layer 25, such as an oxide liner, is conformally deposited on the gate structure and the semiconductor substrate 10. Next, one of the features of the present invention, carbon-containing plasma 13 treatment is performed to incorporate carbon atoms 14 into the insulator layer 25 and carbon atoms 14 can diffuse into the source/drain extension junction region 15 during subsequent heat treatment, such as a furnace annealing treatment and a rapid thermal annealing treatment for recovering damage of the source/drain region. The proceeding temperature of the subsequent heat treatment is about 500 to 1200° C. In this embodiment, without limitation, the rapid thermal annealing treatment whose proceeding temperature is about 900 to 1200° C. for recovering damage of the source/drain region 18 during subsequent processes is used as the subsequent heat treatment. Carbon atoms 14 can sink silicon interstitials to retard boron diffusion so as to make the source/drain extension junction region 15, which also be called as the ultra shallow junction, be stable. Besides, in this embodiment, without limitation, carbon dioxide is used as the source of the carbon-containing plasma. Preferably for the carbon-containing plasma the power level is on the order of 0.1 to 0.5 w/cm2, and the concentration of carbon atoms in the ultra shallow junction is around above 1e19/cm3.

Figure 1D:
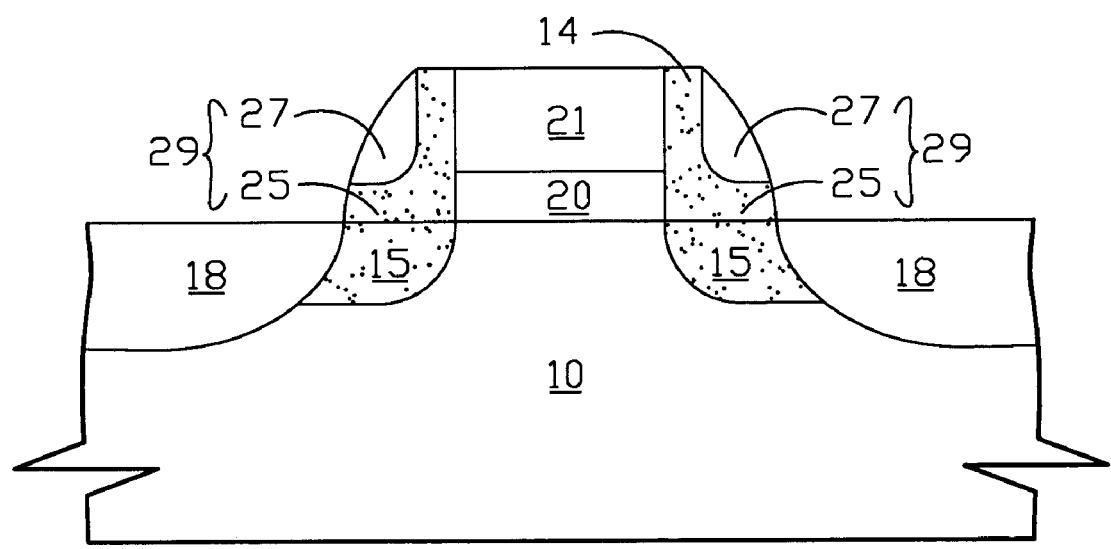

A dielectric liner layer, such as a nitride liner, is first conformally formed on the insulator layer 25. Then, the dielectric liner layer 27 and the insulator layer 25 are etched to form a spacer 29 formed on the side-wall of the gate structure, depicted in FIG. 1C. Next, p-type ion implantation 17 is carried out to the semiconductor substrate 10 so as to form the source/drain region 18, depicted in FIG. 1D. Next, one step of a annealing treatment, such as a rapid thermal annealing treatment, with a condition at about 900 to 1200° C. for about 0 to 30 seconds (dwell time) is carried out to recover damage of the source/drain region 18 and activate the dosage without too much impurity diffusion. Besides, the other of the features of the present invention, the rapid thermal annealing treatment for recovering damage of the source/drain region 18 can also make carbon atoms 14 incorporated within the insulator layer 25 diffuse into the source/ drain extension junction region 15 to reduce boron diffusion, as shown in FIG. 1D.

Figure 1E:
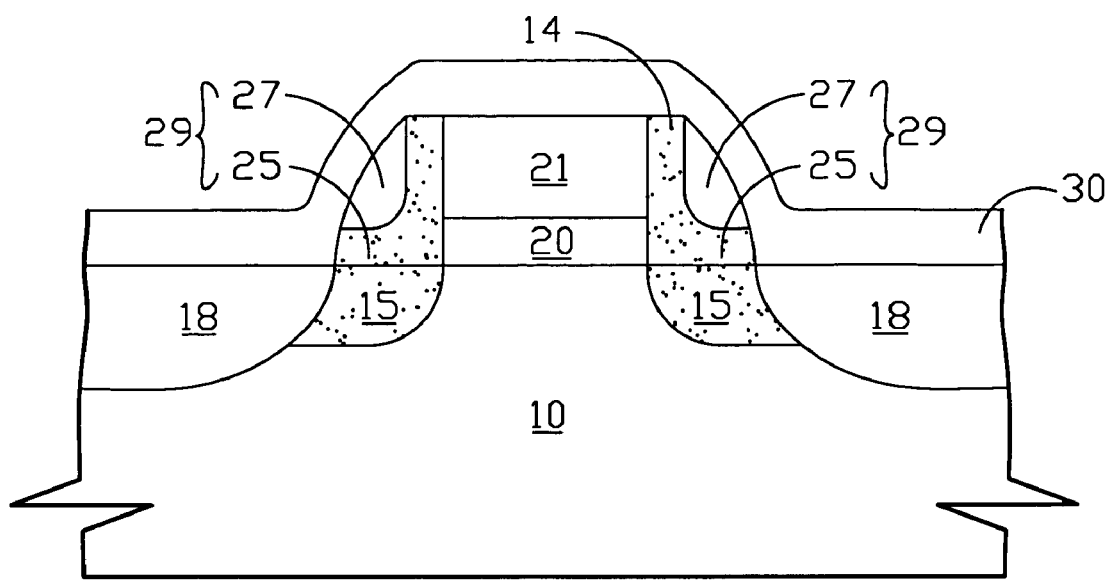
Figure 1F:
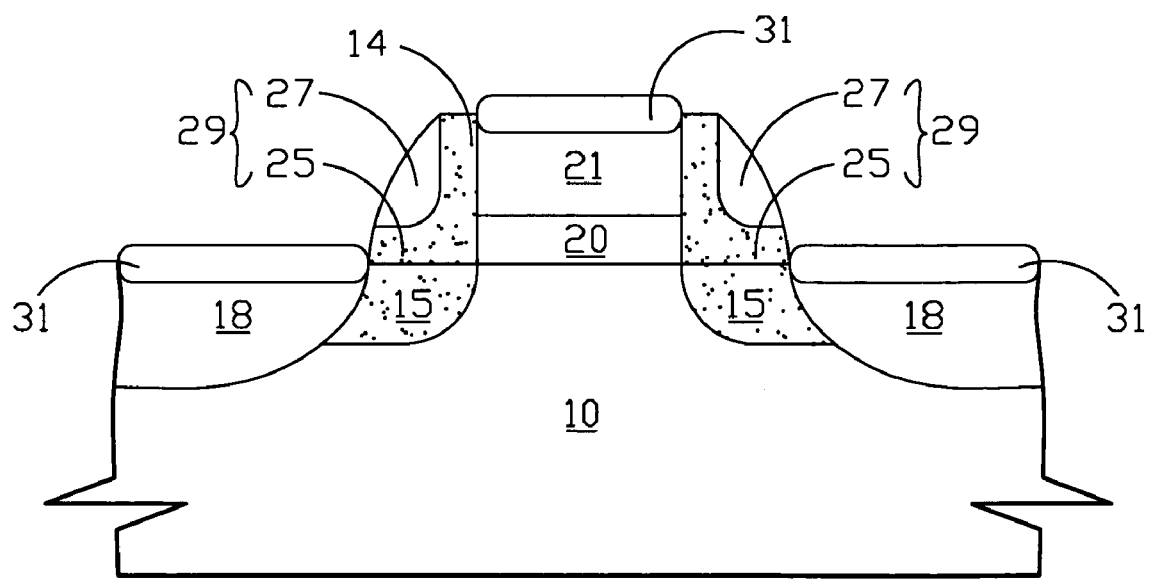

Referring to FIG. 1E, Co metal 30 is deposited on the gate electrode 21 and the source/drain region 18 about 100 angstroms. First CoSi compound is formed on the gate electrode 21 and the source/drain region 18 by annealing in low temperature and the un-reacted Co metal on the gate structure and the source/drain region is removed. Finally, a second thermal annealing is provided to form CoSi2 compound 31, as shown in FIG. 1F.

The method of the present invention can retard the boron diffusion in horizontal and vertical direction and assure the dopant within the ultra shallow junctions not redistribution due to next heat treatment or thermal cycle by the carbon atoms which diffuse into the semiconductor substrate adjusted by the treating time of the carbon-containing plasma and the treating power of the aforesaid plasma.

Above said preferred embodiment is only used to illustrate the present invention, not intended to limit the scope thereof. Many modifications of the preferred embodiment can be made without departing from the spirit of the present invention.

What is claimed is:

1. A method for forming a junction region of a semiconductor device, said method comprising:
   providing a semiconductor substrate;
   forming a gate structure on said semiconductor substrate;
   implanting a dopant into said semiconductor substrate to form a junction region;
   forming an insulator layer on said gate structure and said semiconductor substrate;
   performing a carbon-containing plasma treatment on said insulator layer, and said carbon-containing plasma is performed to penetrate the carbon atoms into said junction region;
   forming a spacer on a side-wall of said gate structure;
   implanting said dopant to form a source/drain region next to said junction region; and
   performing a heat treatment on said semiconductor substrate.

2. The method of claim 1, wherein the step of forming said spacer comprises:
   conformally forming a nitride layer on said insulator layer; and
   removing a portion of said nitride layer and said insulator layer to form said spacer.

3. The method of claim 1, wherein said junction region has a thickness of about less than 400 angstroms.

4. The method of claim 1, wherein said carbon-containing plasma comprises using a source containing carbon dioxide gas.

5. The method of claim 1, wherein said carbon-containing plasma utilizes a power on the order of 0.1 to 0.5 w/cm$^2$.

6. The method of claim 1, wherein said dopant is at least selected from the group consisting of one group III and group V element.

7. The method of claim 1, wherein the concentration of said carbon atoms in said junction region is around above 1e19/cm$^3$.

8. The method of claim 1, wherein the temperature of said heat treatment for said semiconductor substrate is about 500 to 1200° C.

9. The method of claim 1, wherein said heat treatment is selected from the group consisting of a furnace annealing treatment and a rapid thermal annealing treatment.

10. A treatment method for forming junctions of a semiconductor device, said method comprising:
   providing a silicon substrate;
   forming a gate structure on said silicon substrate;
   forming a first spacer on a side-wall of said gate structure;
   implanting a dopant of boron into a portion of said silicon substrate to form a first doped region;
   forming an oxide liner on said first spacer, said gate structure and said silicon substrate;
   performing a carbon-containing plasma treatment on said oxide liner;
   forming a second spacer on said first spacer;

implanting a dopant of p-type into said portion of said silicon substrate to form a second doped region next to said first doped region;

performing a rapid thermal annealing treatment for said silicon substrate; and forming a silicide layer on said gate structure and said silicon substrate.

11. The method of claim 10, wherein said first doped region has a thickness of about less than 400 angstroms.

12. The method of claim 10, wherein said carbon-containing plasma comprises using a source containing carbon dioxide gas.

13. The method of claim 10, wherein said carbon-containing plasma utilizes a power on the order of 0.1 to 0.5 w/cm2.

14. The method of claim 10, wherein said carbon-containing plasma is performed to penetrate carbon atoms into said first doped region, and the concentration of said carbon atoms in said first doped region is around above 1e19/cm3.

15. The method of claim 10, wherein said oxide liner is $SiO_2$.

16. The method of claim 10, wherein said second spacer is $Si_3N_4$.

17. The method of claim 10, wherein the temperature of said rapid thermal annealing treatment for said silicon substrate is about 900 to 1200° C.

18. The method of claim 10, wherein said silicide is self-aligned Co-silide, such as $CoSi_2$.

19. A method for forming a junction region of a semiconductor device, said method comprising:

providing a semiconductor substrate;

forming a gate structure on said semiconductor substrate;

implanting a dopant of group III or group V elements into said semiconductor substrate to form a junction region;

forming an oxide liner on said gate structure and said semiconductor substrate;

performing a carbon-containing plasma treatment on said oxide liner, and said carbon-containing plasma is performed to penetrate carbon atoms into said junction region;

conformally forming a dielectric layer on said oxide liner;

removing a portion of said dielectric layer and said oxide liner to form a spacer on said side-wall of said gate structure;

implanting a dopant of p-type ion into said semiconductor substrate to form a source/drain region next to said junction region;

performing a heat treatment on said semiconductor substrate; and forming a silicide layer on said gate structure and on the surface of said semiconductor substrate.

20. The method of claim 19, wherein said junction region has a thickness of about less than 400 angstroms.

21. The method of claim 19, wherein said carbon-containing plasma comprises using a source containing carbon dioxide gas.

22. The method of claim 19, wherein said carbon-containing plasma utilizes a power on the order of 0.1 to 0.5 $w/cm^2$.

23. The method of claim 19, wherein the concentration of said carbon atoms in said junction region is around above $1e19/cm^3$.

24. The method of claim 19, wherein the temperature of said heat treatment for said semiconductor substrate is about 500 to 1200° C.

25. The method of claim 19, wherein said heat treatment is selected from the group consisting of a furnace annealing treatment and a rapid thermal annealing treatment.

* * * * *